United States Patent [19]

Hart et al.

[11] Patent Number: 4,769,527
[45] Date of Patent: Sep. 6, 1988

[54] THERMAL IMAGE GENERATING DEVICE

[75] Inventors: Alan D. Hart; Alan P. Pritchard, both of Bristol, United Kingdom

[73] Assignee: British Aerospace PLC, London, England

[21] Appl. No.: 903,454

[22] Filed: Sep. 4, 1986

[30] Foreign Application Priority Data

Sep. 4, 1985 [GB] United Kingdom ............... 8521931

[51] Int. Cl.$^4$ ............................................. H05B 1/00
[52] U.S. Cl. .................................... 219/216; 219/543; 250/494.1
[58] Field of Search ..................... 250/493.1, 494.1; 219/354, 543, 553

[56] References Cited

U.S. PATENT DOCUMENTS

| 4,090,060 | 5/1978 | Jornod | 219/216 |
| 4,130,752 | 12/1978 | Conta et al. | 219/543 |
| 4,194,108 | 3/1980 | Nakajima et al. | 219/543 |
| 4,232,212 | 11/1980 | Baraff et al. | 219/543 |
| 4,252,991 | 2/1981 | Iwabushi | 219/543 |
| 4,386,360 | 5/1983 | Murayama | 346/76 PH |
| 4,633,068 | 12/1986 | Grise | 219/543 |
| 4,636,812 | 1/1987 | Bakewell | 219/543 |
| 4,636,813 | 1/1987 | Mego et al. | 219/543 |

FOREIGN PATENT DOCUMENTS 0044756 10/1982 European Pat. Off. .
2117957 10/1983 United Kingdom .

Primary Examiner—Bruce C. Anderson
Attorney, Agent, or Firm—Cushman, Darby & Cushman

[57] ABSTRACT

A thermal image producing device comprising an array of separately addressable thin-film resistors on a substrate with a heat sink at its near face and, so as to render the heat flux flowing through the substrate into the heat sink spatially and temporarily uniform, e.g. to avoid smearing, an array of compensating resistors, each beneath a respective one of the image producing resistors and separated therefrom by an insulating layer. Each compensating resistor is controlled so that, it and its associated image producing resistor together, produce a uniform total heat flux.

7 Claims, 4 Drawing Sheets

THERMAL IMAGE GENERATING DEVICE

BACKGROUND AND SUMMARY OF THE INVENTION

Thermal image producing devices typically use a control system which selectively heats different areas of a screen. U.K. Patent Specification No. 2117957 discloses one such thermal image generating device for use in developing and testing infra-red radiation sensitive electro-optical equipment. This device has a substrate supporting an array of resistor elements which can be selectively heated by the passage of electrical current therethrough. By selectively heating the resistors, the device produces a controllable thermal image made up of pixels which correspond to respective ones of the resistor elements.

At the rear of the substrate, a heat sink is provided to receive and dissipate the heat produced by the resistors. A problem with such a device is that, since the temperatures of the elements are not all the same (and this is necessary so as to produce an image), the heat flux flowing into the heat sink is not spatially uniform. Moreover, since the image varies with time, the heat flux flowing into the heat sink at one point on its surface will also vary with time.

An object of the invention is to provide a thermal image generating device comprising a resistor array from which the produced heat flux is at least more spatially and temporally uniform.

According to one aspect of the present invention, there is provided a thermal image producing device that has an array of first and second resistor elements and electrical current supply means connected to the elements for enabling them to be selectively heated by the passage of electrical current therethrough. The elements are arranged such that heat produced by the first elements is receivable from the device as a controllably variable thermal image while the heat produced by the second elements renders the distribution of the heat flux produced by all the elements substantially uniform over the area of the array.

According to a second aspect of the invention there is provided a thermal image producing device that has a first planar array of resistor elements, electrical current supply means connected to the elements of the first array for enabling them to be selectively heated by the passage of current therethrough and thereby to produce a controllably variable thermal image at one side of the array, a second planar array of resistor elements positioned at the other side of the first array with each element of the second array adjacent a respective corresponding one of the elements of the first array but insulated from said respective corresponding one element of the first array, and from said one side of the first array, by dielectric material; and cooling means for receiving heat from the said other side of the first array and from said second array, the electrical current supply means being further connected to the elements of the second array for enabling them to be selectively heated by the passage of current therethrough to render the distribution of the heat flux produced by all the elements substantially uniform over the area of the arrays.

BRIEF DESCRIPTION OF THE DRAWINGS

For a better understanding of the invention, reference will be made, by way of example, to the accompanying drawings, in which.

DESCRIPTION OF THE PREFERRED EMBODIMENT

Figure 4:
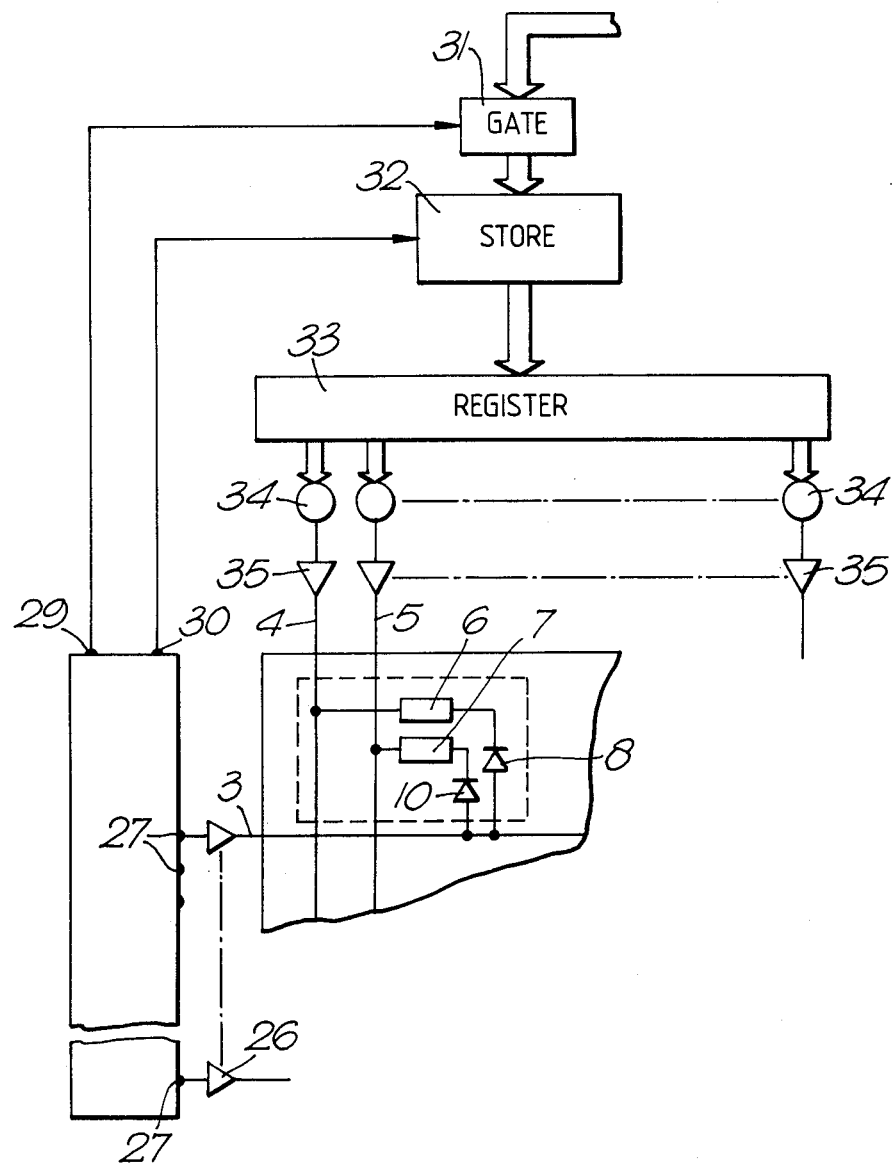
FIG. 4 is a circuit diagram of part of the FIG. 1 device and its drive electronics.

The device shown in drawing FIG. 4 of UK Patent Specification No. 2117957 comprises a two-dimensional planar array of thin-film resistors mounted on respective dielectric portions which are in turn mounted on a substrate with a bus-bar structure arranged between the dielectric portions and the substrate. The bus-bar structure comprises a matrix of column and row bus-bars, each resistor being connected between one row and, via a series diode, one column bus-bar. By applying appropriate currents to the column bus-bars while strobing the row bus-bars, the resistor elements may be selectively heated to produce a controllably variable thermal image. In a modification shown in FIG. 7 of the prior specification, the bus-bars are used to address and control the potential stored on a matrix of capacitors which, in turn, control the currents flowing through respective ones of the resistor elements. The capacitors thus act as latching elements which maintain the temperatures of the resistor elements between successive updates thereof.

In the device to be described herein, for each resistor element which forms part of the image producing array, i.e. for each 'emitter' resistor, there is provided a second compensating resistor similar (if not identical) to the emitter resistor but positioned on the substrate directly below the emitter resistor and separated from it by a dielectric layer. The resistors are independently addressed so that the total power dissipated is constant: this is controlled by the external drive electronics. To a first order approximation the compensation technique gives the following advantages:

(i) The total heat flux leaving the rear of the substrate is uniform and constant; i.e. there is no variation over the area of the device or with time.

(ii) The uniform heat flux means that no lateral temperature gradients will exist even if a large temperature gradient vertically into the heat sink exists. (In the uncompensated case the heat flux was temporally and spatially varying).

(iii) The spatial uniformity allows a large vertical temperature gradient to exist without thermally smearing the displayed image thus heat sinking across a metal heat sink to a large finned area in for instance, liquid Nitrogen could be used. Instead of the latter form of cooler, one which makes use of nucleate boiling could be used, but this is not preferred because nuclear boiling may impose a peak heat flux thus limiting the maximum display temperature for a given time response.

The image generating device of FIGS. 1 to 4 comprises a deeply finned Molybdenum heatsink 1 supporting a silicon substrate 2. The substrate supports a structure including a series of parallel row bus-bars 3, a series of parallel column bus-bars 4 and 5 which are orthogonal to the row bus-bars so that the bus-bars form a matrix, and two arrays of thin-film resistors 6 and 7. The resistors 6 are exposed at the outer surface of the structure and are used to produce the thermal image. They are connected to respective ones of the column bus-bars 4 and, via a respective diode 8, to a respective one of the row bus-bars 3. Thus, via the bus-bars 3 and 4, the resistors 6 can be selectively addressed and heated by the passage of electrical current therethrough to produce the required image. Meanwhile, the resistors 7 lie beneath respective ones of the resistors 6, separated therefrom by an insulation layer 9 of Polyimide, and are each connected between that respective column bus-bar 5 which is adjacent to the bus-bar 4 connected to the overlying resistor 6 and, via a diode 10, to the respective bus-bar 3 coupled to that overlying resistor 6. Thus, via the bus-bars 3 and 5, the resistors 7 can also be selectively addressed and supplied with electrical current.

Figure 1:
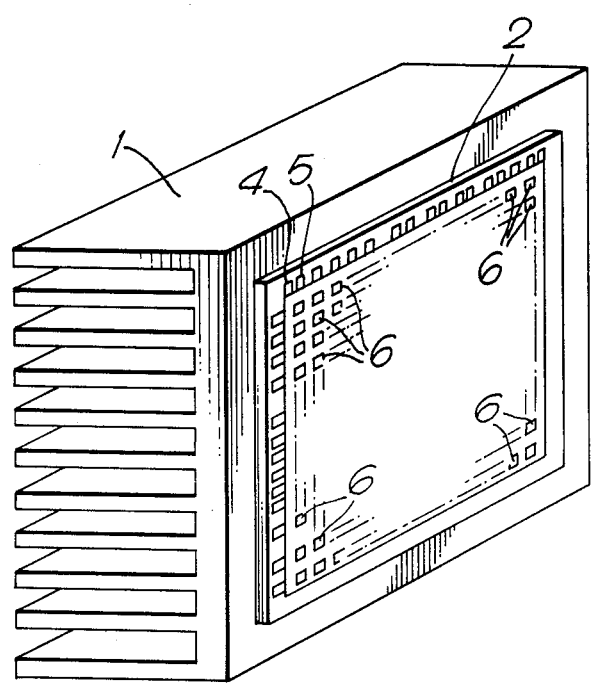
FIG. 1 is a perspective view of part of a thermal image producing device.
Figure 2:
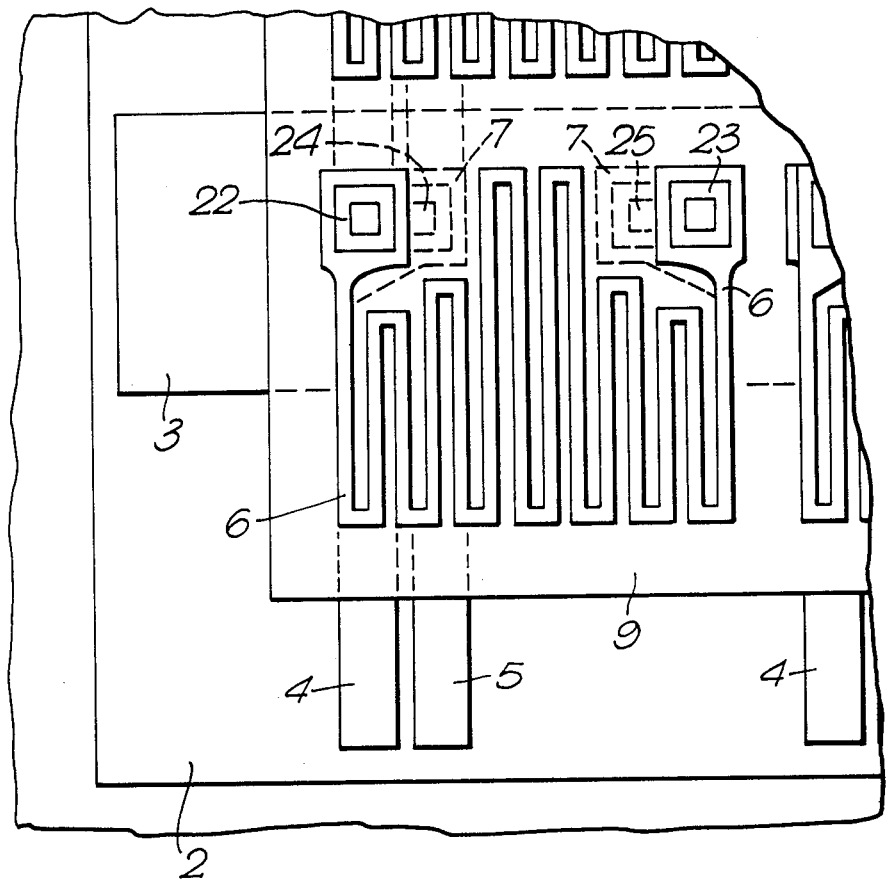
FIG. 2 is a plan view including one pixel resistor of the device.
Figure 3:
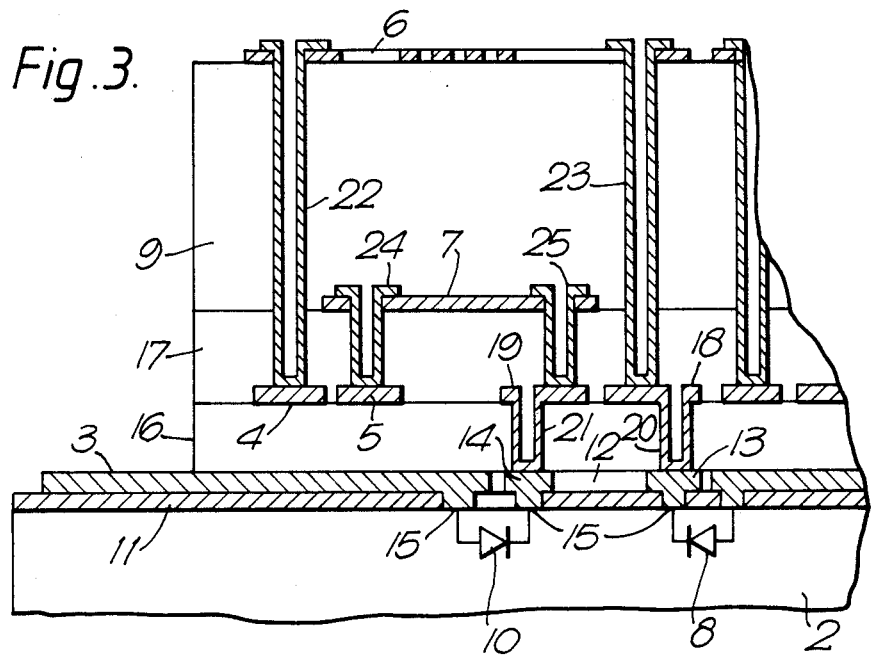
FIG. 3 is a partly diagrammable sectional view on line 3—3 in FIG. 2.

Referring to FIGS. 2 and 3, the substrate 2 is provided with a surface layer 11 of oxide dielectric and the diodes 8 and 10 are integrated into the substrate. The row bus-bars 3 are deposited on layer 11. For each associated pair of the resistors 6 and 7, i.e. each resistor 6 and the underlying resistor 7, an aperture 12 is provided in the row bus-bars and two connection pads 13 and 14 are provided on layer 11 within the aperture.

The row bus-bars and the pads 13 and 14 are connected to the underlying structures of the diodes 8 and 10 via holes 15 in the oxide layer 11. The diodes 8 and 10 are illustrated diagrammatically. The choice of physical structure and the means for forming them, and any consequent modification of the row bus-bar and pad geometry, are all design details within the capabilities of those skilled in the art. By way of example, each diode might be fabricated, in an epitaxial n- layer grown on a p- substrate, within a reverse-biased 'bucket diode' formed by an encircling p region and the underlying p- substrate, the function of the bucket diode being to electrically isolate the diodes 8 and the diodes 10 one from another. Each diode 8 and 10 could have a central anode contact and several cathode contacts around it. Then, of course, the detailed geometry of the pads and row bus-bars will need appropriate adaptation from what is shown in FIG. 3.

First and second relatively thin layers 16 and 17 of polyimide are deposited over the bus-bars 3, pads 13 and 14 and oxide layer 11 and the much thicker polyimide layer 9 is provided over the layers 16 and 17. The column bus-bars 4 and 5 are formed on the first polyimide layer 16 along with, for each pair of resistors 6 and 7, two connection tags 18 and 19 which connect by way of 'vias' 20 and 21 respectively (through connection for example placed through holes as shown) to respective ones of the pads 13 and 14. The resistors 6 and 7, formed by etching of respective layers of titanium, are provided on the outer surfaces of respective ones of the polyimide layers 9 and 17. They are connected, one side of each to a respective one of the corresponding pair of adjacent column bus-bars 4 and 5 and the other side of each to a respective one of the corresponding two tags 18 and 19, by way of vias 22, 23, 24 and 25. The holes for the vias 20 to 25 could be formed by plasma etching.

As shown in FIG. 4, the row bus-bars 3 are connected by way of respective amplifiers 26 to respective ones of a series of row selection output terminals 33 of a control circuit 38 which has two further output terminals 29 and 30 connected to respective ones of a gating arrangement 31 and a buffer store 32. Image signals, say from an image frame store fed by a television camera (not shown) viewing a scene to be reproduced as an image or from an image generating computer (not shown), are received by gating arrangement 31 and, on command from control circuit 28, are passed onto the buffer store is to allow for the likelihood that the frame update rate of the image signal providing apparatus, for instance the t.v. camera or computer, will be much slower than the best update rate for the thermal image producing device. Thus, the buffer store content may be updated via the gating arrangement 31 at the frame rate of the signal providing apparatus, for instance every 25 milliseconds, and then read out from the buffer store 32 to control the image generator many times within each 25 millisecond period. The content of store 32 is read, row-by-row, into a register 33 under the control of circuit 28,. Each digital pixel signal of the row held in the register 33 is fed to a respective one of a plurality of devices 34, one for each of the column bus-bars 4 and 5, which produce respective resistor drive currents corresponding to the digital pixel signals. The drive currents are fed via amplifiers 35 to the column bus-bars 4 and 5. The resistors 6 and 7 are separately addressed so that they always dissipate the same total power. Meanwhile, the circuit 28 applies a potential, via the appropriate one of its terminal 27 and the associated amplifier 26, only to the row bus-bar 3 which corresponds to the image pixel row held in the register 33, so as to turn on the diodes 8 and 10 connected to that row bus-bar. The potential on the other row bus-bars at this time is made such as to keep the diodes connected thereto turned off. Thus, the resistors 6 and 7 of the corresponding image generating array row pass the respective drive currents, ie this row is updated. After any row has been updated, the next image signal row is read into the register 33 and the corresponding next row bus-bar has the diode turn on potential applied thereto. When all the rows have been updated, the sequence is repeated. As noted, the sequence of updating the generated thermal image may occur many times for each update of the image frame held in the buffer store 32.

Figure 5:
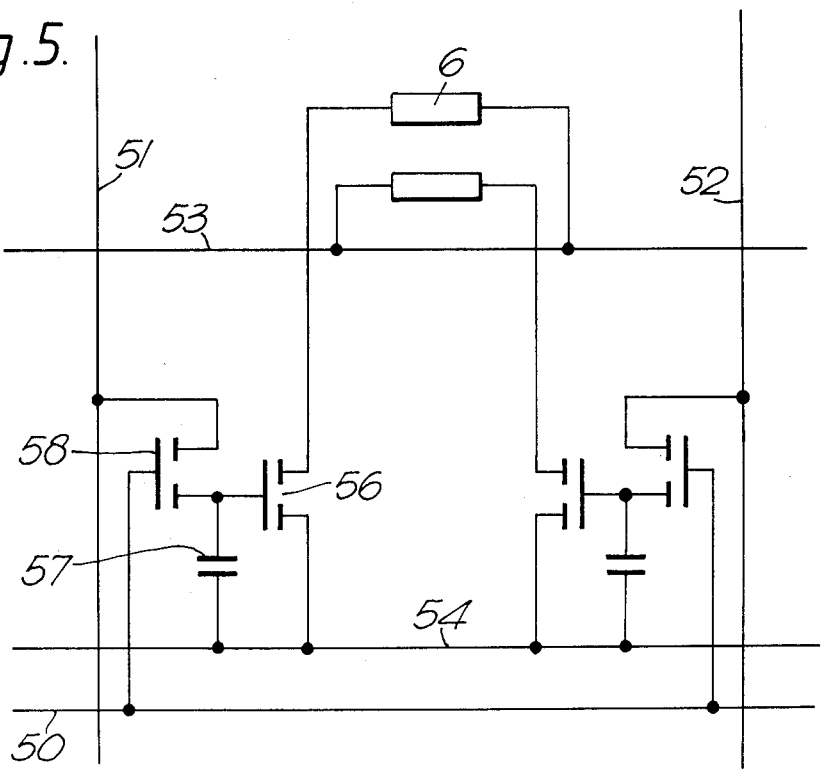
FIG. 5 is a circuit diagram for illustrating a modification of the FIG. 1 device.

An alternative embodiment utilizing latching circuits is shown in FIG. 5. Each pixel circuit comprising resistors 6 and 7 connects to a corresponding row bus-bar 50 and two column bus-bars 51 and 52 as before, but now also receives drive power from drive rails 53 and 54. The emitter resistor 6 is connected between rail 53 and the collector of transistor 56 of which the base is connected to be controlled by the potential stored on capacitor 57. That potential is in turn updated, each time the row bus-bar is strobed, by the signal applied via transistor 58 from column bus-bar 51. A similar circuit controls the current flowing through the compensating resistor 7.

Even if the resistors 6 and 7 in the described embodiments always dissipate the same total power there can still be transient imbalances. For example suppose that at $t=o$, the power in resistor 6 is zero (hence resistor 7 dissipates P) and then a step function change reverses this $R_G \rightarrow D_{max} R_7 \rightarrow 0$ the time constant for heat to reach the substrate from $R_6$ is longer than from $R_7$, since $R_7$ is closer to the heat sink 1. The effect of $R_7$ changing therefore is seen by the substrate before the increase in flux from $R_6$; thus at the changeover there will be a transient drop in the flux in the substrate.

In order to reduce the thermal transient, the signal to $R_7$ can be delayed by a time equivalent to the response of $R_6$. A simple first order electronic filter incorporated at each pixel would suffice to do this. It may also be possible to incorporate this response shaping in the signal handling external to the device.

A further advantage of the uses of the compensating resistors is that at constant power eases the design of the drive electronics, with the prior art devices disclosed in UK Patent Application No. 2117957A to drive the device it may be necessary to have the electronics dump compensation power into dummy loads.

We claim:

1. A thermal image producing device comprising:
   a first array of resistor elements;
   a second array of resistor elements;
   a heat sink, adjacent which said first and second arrays are mounted, such that said second array is closer to said heat sink than said first array;
   means for thermally and electrically insulating between said first and second arrays; and
   electrical current supply means; connected to said resistor elements; for selectively heating said elements by passing electrical current therethrough, wherein the elements are arranged such that heat produced by elements in said first array is receivable from the device as a controllably variable thermal image, while heat produced by elements in said second array is such to render the distribution of the heat flux produced by all the elements substantially uniform over the area of the arrays.

2. A thermal image producing device comprising:
   a first planar array of resistor elements;
   electrical current supply means connected to the elements of the first array for selectively heating said elements by the passage of current therethrough to thereby produce a controllably variable thermal image at one side of the array;
   a second planar array of resistor elements positioned at the other side of the first array with each element of the second array adjacent a respective corresponding one of the elements of the first array;
   a dielectric material between said first and second planar array for thermally and electrically insulating each element of said second array from said respective corresponding one element of said first array and from said one side of said first array; and
   cooling means for receiving heat from the said other side of the first array and from said second array,
   the electrical current supply means being further connected to the elements of the second array and includes means for selectively heating said elements of said second array by the passage of current therethrough to render the distribution of the heat flux produced by all the elements substantially uniform over the area of the arrays.

3. A device as in claim 1 wherein said resistor elements in said first array are each respectively paired with said resistor elements in said second array, and wherein said electrical supply means includes means for separately addressing ones of said pairs of said resistors such that said resistor pair always dissipates a same total power.

4. A device as in claim 2 wherein said resistor elements in said first array are each respectively paired with said resistor elements in said second array, and wherein said electrical supply means includes means for separately addressing ones of said pairs of said resistors such that said resistor pair always dissipates a same total power.

5. An apparatus as in claim 3 wherein said electrical current supply means includes means for delaying control signals to resistor elements in said second array relative to control signals to elements in said first array, thus compensating for relative proximities of said arrays to said heat sink.

6. An apparatus as in claim 4 wherein said electrical current supply means includes means for delaying control signals to resistor elements in said second array relative to control signals to elements in said first array, thus compensating for relative proximities of said arrays to said cooling means.

7. A device as in claim 5 further comprising a plurality of first order electronic filters connected to elements in said second array.

* * * * *